US012526946B2

(12) United States Patent
Shih et al.

(10) Patent No.: US 12,526,946 B2
(45) Date of Patent: Jan. 13, 2026

(54) RAIL MOUNTING BACKPLANE ASSEMBLY KIT AND RELATED RAIL MOUNTING ELECTRONIC DEVICE

(71) Applicant: Moxa Inc., New Taipei (TW)

(72) Inventors: Chun-Jen Shih, New Taipei (TW); Chih-Hsiang Tang, New Taipei (TW)

(73) Assignee: Moxa Inc., New Taipei (TW)

( * ) Notice: Subject to any disclaimer, the term of this patent is extended or adjusted under 35 U.S.C. 154(b) by 166 days.

(21) Appl. No.: 18/533,014

(22) Filed: Dec. 7, 2023

(65) Prior Publication Data
US 2024/0407120 A1 Dec. 5, 2024

Related U.S. Application Data

(60) Provisional application No. 63/469,551, filed on May 30, 2023.

(51) Int. Cl.
*H05K 7/14* (2006.01)
*H05K 7/18* (2006.01)

(52) U.S. Cl.
CPC .............. *H05K 7/14* (2013.01); *H05K 7/1438* (2013.01); *H05K 7/1474* (2013.01); *H05K 7/18* (2013.01)

(58) Field of Classification Search
CPC ...... H05K 7/14; H05K 7/1438; H05K 7/1474; H05K 7/18; H05K 5/0208; E05B 73/00;
(Continued)

(56) References Cited

U.S. PATENT DOCUMENTS 1,659,676 A * 2/1928 Vincent ..................... F02F 1/10
123/41.77
3,339,954 A * 9/1967 Alvden ..................... E04B 2/74
403/292
(Continued)

FOREIGN PATENT DOCUMENTS

| CN | 105789931 A | 7/2016 |
| CN | 108141977 A | 6/2018 |

(Continued)

OTHER PUBLICATIONS

Tang, the specification, including the claims, and drawings in the U.S. Appl. No. 18/528,803, filed Dec. 5, 2023.
(Continued)

*Primary Examiner* — Rockshana D Chowdhury
*Assistant Examiner* — Martin Antonio Asmat Uceda
(74) *Attorney, Agent, or Firm* — Winston Hsu

(57) ABSTRACT

A rail mounting backplane assembly kit is provided and includes a backplane assembly, an engaging hook and a slot structure. The backplane assembly can be mounted on a rail and detachably assembled with a first cooperating backplane assembly or a second cooperating backplane assembly. The engaging hook is movably disposed on the backplane assembly. The engaging hook includes an operating portion, an engaging portion and a connecting portion connected between the operating portion and the engaging portion and received inside the backplane assembly. The operating portion and the engaging portion are exposed out of the backplane assembly. The engaging portion is for engaging with a cooperating slot structure on the first cooperating backplane assembly. The slot structure is formed on the backplane assembly and for engaging with a cooperating engaging hook on the second cooperating backplane assembly.

(Continued)

Besides, a related rail mounting electronic device is also provided.

24 Claims, 13 Drawing Sheets

(58) Field of Classification Search
CPC ... H01R 13/60; Y10S 439/928; Y10T 403/59; Y10T 403/595; Y10T 403/7005
See application file for complete search history.

(56) References Cited

U.S. PATENT DOCUMENTS

| | | | | |
|---|---|---|---|---|
| 4,501,460 | A * | 2/1985 | Sisler | H05K 7/1435 361/732 |
| 4,558,914 | A * | 12/1985 | Prager | H05K 7/1465 439/294 |
| 4,648,737 | A * | 3/1987 | Lake, Jr. | H01R 13/60 403/321 |
| 4,738,632 | A * | 4/1988 | Schmidt | H05K 7/1465 439/341 |
| 5,253,140 | A | 10/1993 | Inoue | |
| 5,493,194 | A * | 2/1996 | Damiano | H05K 7/1484 318/575 |
| 5,508,886 | A * | 4/1996 | Bernecker | H05K 7/1474 361/728 |
| 5,677,830 | A * | 10/1997 | Nogas | H05K 7/1435 361/732 |
| 5,737,189 | A * | 4/1998 | Kammersgard | G06F 1/187 |
| 6,008,985 | A * | 12/1999 | Lake | G05B 19/4185 361/753 |
| 6,172,875 | B1 * | 1/2001 | Suzuki | H05K 7/1465 361/752 |
| 6,520,605 | B2 * | 2/2003 | Nunokawa | H05K 5/0204 312/111 |
| 6,840,819 | B2 * | 1/2005 | Bet | H05K 7/1474 439/94 |
| 7,021,974 | B2 * | 4/2006 | Sichner | H05K 5/30 439/732 |
| 7,073,971 | B2 * | 7/2006 | Schurr | H05K 7/1474 439/94 |
| 7,210,586 | B2 * | 5/2007 | Ice | H05K 7/1418 361/756 |
| 7,299,667 | B1 * | 11/2007 | Miresmaili | E05G 1/005 109/51 |
| 7,374,453 | B1 * | 5/2008 | Allcock | E01B 9/38 439/716 |
| 8,597,037 | B2 * | 12/2013 | Halim | H01R 9/2458 439/717 |
| 8,628,004 | B2 * | 1/2014 | Vazach | G06F 13/10 235/462.46 |
| 9,153,910 | B2 * | 10/2015 | Aoki | H01R 13/62938 |
| 9,276,349 | B2 * | 3/2016 | Yoshida | H01R 13/665 |
| 9,325,110 | B2 | 4/2016 | Lostoski | |
| 9,386,718 | B2 * | 7/2016 | Kusumi | H05K 7/12 |
| 9,408,321 | B2 * | 8/2016 | Nomoto | H05K 5/30 |
| 9,444,231 | B2 * | 9/2016 | Ho | H02B 1/0523 |
| 9,483,928 | B2 | 11/2016 | Molnar | |
| 9,564,707 | B2 * | 2/2017 | Geitner | H05K 7/1478 |
| 9,865,945 | B2 * | 1/2018 | Isobe | H01R 9/2608 |
| 9,894,797 | B2 * | 2/2018 | Sampath | H05K 7/18 |
| 9,936,598 | B2 * | 4/2018 | Gruber | H01R 9/2675 |
| 9,966,714 | B1 * | 5/2018 | Sreedharan | H01R 13/6271 |
| 10,314,194 | B1 * | 6/2019 | Chiang | H05K 5/0065 |
| 10,483,663 | B2 | 11/2019 | Wrobel | |
| 10,716,235 | B1 * | 7/2020 | Farnsworth | H05K 7/1474 |
| 11,243,504 | B2 | 2/2022 | Wrobel | |
| 11,347,195 | B2 | 5/2022 | Kretschmann | |
| 11,408,560 | B2 | 8/2022 | Miyake | |
| 11,576,275 | B2 * | 2/2023 | Huang | H05K 7/12 |
| 11,659,676 | B2 * | 5/2023 | Chung | H05K 7/1438 361/679.01 |
| 12,245,391 | B2 * | 3/2025 | Ke | H05K 5/0247 |
| 2001/0046144 | A1 | 11/2001 | Murabayashi | |
| 2003/0143896 | A1 * | 7/2003 | Bet | H05K 7/1474 439/716 |
| 2006/0221581 | A1 | 10/2006 | DeNies | |
| 2010/0200523 | A1 * | 8/2010 | Henderson | H05K 7/18 211/26 |
| 2015/0015129 | A1 * | 1/2015 | Ding | G06F 1/181 312/223.1 |
| 2015/0214657 | A1 | 7/2015 | Geitner | |
| 2015/0250312 | A1 | 9/2015 | Barrett | |
| 2015/0349452 | A1 * | 12/2015 | Yoshida | H01R 13/639 439/347 |
| 2018/0020564 | A1 * | 1/2018 | Kang | H05K 7/1474 |
| 2022/0256731 | A1 | 8/2022 | Gurlt | |
| 2024/0407123 | A1 | 12/2024 | Shih | |

FOREIGN PATENT DOCUMENTS

| | | |
|---|---|---|
| CN | 109729678 A | 5/2019 |
| CN | 107305992 B | 6/2020 |
| CN | 211128561 U | 7/2020 |
| DE | 6 78 23 090.7 U1 | 7/1981 |
| EP | 0 661 915 A1 | 7/1995 |
| EP | 0 599 551 B1 | 8/1996 |
| EP | 0 896 504 A2 | 2/1999 |
| EP | 0 944 121 A1 | 9/1999 |
| EP | 1 595 313 B1 | 6/2007 |
| JP | 62-98287 A | 5/1987 |
| JP | 62-98287 U | 6/1987 |
| JP | 4-19976 A | 1/1992 |
| JP | 6-216549 A | 8/1994 |
| JP | 11-103182 A | 4/1999 |
| JP | 11-168284 A | 6/1999 |
| JP | 11-274758 A | 10/1999 |
| JP | 11-284360 A | 10/1999 |
| JP | 11-354944 A | 12/1999 |
| JP | 2000-59043 A | 2/2000 |
| JP | 2001-217016 A | 8/2001 |
| JP | 2002-231353 A | 8/2002 |
| JP | 2002-231385 A | 8/2002 |
| JP | 2003-298251 A | 10/2003 |
| JP | 2003-298256 A | 10/2003 |
| JP | 2006-114908 A | 4/2006 |
| JP | 2010-113444 A | 5/2010 |
| JP | 2013-74020 A | 4/2013 |
| JP | 2016-35845 A | 3/2016 |
| JP | 2016-54266 A | 4/2016 |
| JP | 6087479 B1 | 3/2017 |
| JP | 2021-81766 A | 5/2021 |
| TW | 202119145 A | 5/2021 |
| WO | 2009/140987 A1 | 11/2009 |
| WO | 2014/016190 A2 | 1/2014 |

OTHER PUBLICATIONS

Shih, the specification, including the claims, and drawings in the U.S. Appl. No. 18/631,067, filed Apr. 10, 2024.

* cited by examiner

RAIL MOUNTING BACKPLANE ASSEMBLY KIT AND RELATED RAIL MOUNTING ELECTRONIC DEVICE

CROSS REFERENCE TO RELATED APPLICATIONS

This application claims the benefit of U.S. Provisional Application No. 63/469,551, filed on May 30, 2023. The content of the application is incorporated herein by reference.

BACKGROUND OF THE INVENTION

1. Field of the Invention

The present invention relates to a rail mounting backplane assembly kit and a related rail mounting electronic device, and more specifically, to a rail mounting backplane assembly kit and a related rail mounting electronic device with improved modular designs.

2. Description of the Prior Art

Modularity has gradually become a mainstream trend of rail mounting electronic devices. For example, a remote terminal unit is a rail mounting electronic device installed at a field location as part of a monitor/control system for monitoring/controlling field devices. The remote terminal unit usually includes multiple modules, which may include a power module, a switch module, a computing module, and an input/output module, and a common backplane for mounting the multiple modules. Therefore, an improvement for a modular design is urgently needed.

SUMMARY OF THE INVENTION

It is an objective of the present invention to provide a rail mounting backplane assembly kit and a related rail mounting electronic device with improved modular designs for solving the aforementioned problem.

In order to achieve the aforementioned objective, the present invention discloses a rail mounting backplane assembly kit. The rail mounting backplane assembly kit includes a backplane assembly, an engaging hook and a slot structure. The backplane assembly is configured to be mounted on a rail and detachably assembled with a first cooperating backplane assembly or a second cooperating backplane assembly. The engaging hook is disposed on the backplane assembly and movable relative to the backplane assembly between an engaging position and a disengaging position. The engaging hook includes an operating portion, an engaging portion and a connecting portion. The operating portion is exposed out of the backplane assembly. The engaging portion is exposed out of the backplane assembly. The engaging portion is configured to engage with a cooperating slot structure formed on the first cooperating backplane assembly when the engaging hook is located at the engaging position, and the engaging portion is configured to disengage from the cooperating slot structure when the engaging hook is located at the disengaging position. The connecting portion is connected between the operating portion and the engaging portion and received inside the backplane assembly. The slot structure is formed on the backplane assembly and configured to engage with a cooperating engaging hook disposed on the second cooperating backplane assembly.

According to an embodiment of the present invention, the backplane assembly includes an uncovered side and a covered side. The uncovered side of the backplane assembly is not covered by the first cooperating backplane assembly when the backplane assembly is assembled with the first cooperating backplane assembly. The covered side of the backplane assembly is covered by the first cooperating backplane assembly when the backplane assembly is assembled with the first cooperating backplane assembly. The operating portion is exposed out of the uncovered side of the backplane assembly. The engaging portion is exposed out of the covered side of the backplane assembly, and the connecting portion is received inside the backplane assembly.

According to an embodiment of the present invention, the uncovered side of the backplane assembly is an upper side or a lower side of the backplane assembly.

According to an embodiment of the present invention, a stopping protrusion is formed on the connecting portion, and a cooperating stopping protrusion is formed on the backplane assembly and configured to abut against the stopping protrusion to stop the engaging hook at the disengaging position.

According to an embodiment of the present invention, the stopping protrusion passes over the cooperating stopping protrusion when the engaging hook moves from the engaging position to the disengaging position.

According to an embodiment of the present invention, an abutting surface is formed on the engaging portion and configured to abut against a cooperating abutting surface formed on the first cooperating backplane assembly to drive the engaging hook to move away from the engaging position for allowing the engaging portion to at least partially enter into the cooperating slot structure.

According to an embodiment of the present invention, the abutting surface is configured to abut against the cooperating abutting surface to drive the engaging hook to move from the engaging position to a predetermined position, and the stopping protrusion does not pass over the cooperating stopping protrusion when the engaging hook moves from the engaging position to the predetermined position.

According to an embodiment of the present invention, the rail mounting backplane assembly kit further includes a recovering component configured to bias the engaging hook to move toward the engaging position.

According to an embodiment of the present invention, a guiding structure is formed on the connecting portion, and a cooperating guiding structure is formed on the backplane assembly and configured to cooperate with the guiding structure for guiding the engaging hook.

According to an embodiment of the present invention, the guiding structure is a guiding slot structure, and the cooperating guiding structure is a guiding column structure passing through the guiding structure and movable within the guiding structure along a longitudinal direction of the guiding structure.

According to an embodiment of the present invention, at least one facilitating protrusion is formed on the connecting portion and configured to facilitate a movement of the engaging hook.

According to an embodiment of the present invention, an assembling direction of the backplane assembly relative to the first cooperating backplane assembly and an assembling direction of the backplane assembly relative to the second cooperating backplane assembly are perpendicular to a moving direction of the engaging hook relative to the backplane assembly.

In order to achieve the aforementioned objective, the present invention further discloses a rail mounting electronic device. The rail mounting electronic includes a first module, a second module and a first engaging assembly. The first module is configured to be mounted on a rail. The second module is configured to be mounted on the rail and detachably assembled with the first module. The first engaging assembly includes a first slot structure and a first engaging hook. The first slot structure is formed on the first module. The first engaging hook is disposed on the second module and movable relative to the second module between a first engaging position and a first disengaging position. The first engaging hook includes a first operating portion, a first engaging portion and a first connecting portion. The first operating portion is exposed out of the second module. The first engaging portion is exposed out of the second module. The first engaging portion engages with the first slot structure when the first engaging hook is located at the first engaging position, and the first engaging portion disengages from the first slot structure when the first engaging hook is located at the first disengaging position. The first connecting portion is connected between the first operating portion and the first engaging portion and received inside the second module.

According to an embodiment of the present invention, the first module includes a first backplane assembly configured to be mounted on the rail. The second module includes a second backplane assembly configured to be mounted on the rail and detachably assembled with the first backplane assembly. The second backplane assembly includes an uncovered side and a covered side. The uncovered side of the second backplane assembly is not covered by the first backplane assembly when the second backplane assembly is assembled with the first backplane assembly. The covered side of the second backplane assembly is covered by the first backplane assembly when the second backplane assembly is assembled with the first backplane assembly. The first engaging hook is movably disposed on the second backplane assembly. The first operating portion is exposed out of the uncovered side of the second backplane assembly. The first engaging portion is exposed out of the covered side of the second backplane assembly, and the first connecting portion is received inside the second backplane assembly.

According to an embodiment of the present invention, a first stopping protrusion is formed on the first connecting portion, and a first cooperating stopping protrusion is formed on the second backplane assembly and configured to abut against the first stopping protrusion to stop the first engaging hook at the first disengaging position.

According to an embodiment of the present invention, the first stopping protrusion passes over the first cooperating stopping protrusion when the first engaging hook moves from the first engaging position to the first disengaging position.

According to an embodiment of the present invention, a first abutting surface is formed on the first engaging portion, and a first cooperating abutting surface is formed on the first backplane assembly and configured to abut against the first abutting surface to drive the first engaging hook to move away from the first engaging position for allowing the first engaging portion to at least partially enter into the first slot structure.

According to an embodiment of the present invention, the first cooperating abutting surface is configured to abut against the first abutting surface to drive the first engaging hook to move from the first engaging position to a first predetermined position, and the first stopping protrusion does not pass over the first cooperating stopping protrusion when the first engaging hook moves from the first engaging position to the first predetermined position.

According to an embodiment of the present invention, the first engaging assembly further includes a first recovering component configured to bias the first engaging hook to move toward the first engaging position.

According to an embodiment of the present invention, a first guiding structure is formed on the first connecting portion, and a first cooperating guiding structure is formed on the second backplane assembly and configured to cooperate with the first guiding structure for guiding the first engaging hook.

According to an embodiment of the present invention, the first guiding structure is a guiding slot structure, and the first cooperating guiding structure is a guiding column structure passing through the first guiding structure and movable within the first guiding structure along a longitudinal direction of the first guiding structure.

According to an embodiment of the present invention, at least one first facilitating protrusion is formed on the first connecting portion and configured to facilitate a movement of the first engaging hook.

According to an embodiment of the present invention, an assembling direction of the second backplane assembly relative to the first backplane assembly is perpendicular to a moving direction of the first engaging hook relative to the second backplane assembly.

According to an embodiment of the present invention, the uncovered side of the second backplane assembly is an upper side or a lower side of the second backplane assembly.

According to an embodiment of the present invention, the first module further includes a first detachable assembly detachably assembled with the first backplane assembly. The second module further includes a second detachable assembly detachably assembled with the second backplane assembly, and the uncovered side of the second backplane assembly is not covered by the second detachable assembly when the second detachable assembly is assembled with the second backplane assembly.

According to an embodiment of the present invention, the rail mounting electronic device further includes a third module and a second engaging assembly. The third module includes a third backplane assembly and a third detachable assembly. The third backplane assembly is configured to be mounted on the rail and detachably assembled with the second backplane assembly. The second backplane assembly is located between the first backplane assembly and the third backplane assembly when the second backplane assembly and the third backplane assembly are assembled with the first backplane assembly and the second backplane assembly respectively. The third backplane assembly includes an uncovered side and a covered side. The uncovered side of the third backplane assembly is not covered by the second backplane assembly when the third backplane assembly is assembled with the second backplane assembly. The covered side of the third backplane assembly is covered by the second backplane assembly when the third backplane assembly is assembled with the second backplane assembly. The third detachable assembly is detachably assembled with the third backplane assembly. The uncovered side of the third backplane assembly is not covered by the third detachable assembly when the third detachable assembly is assembled with the third backplane assembly. The second engaging assembly includes a second slot structure and a second engaging hook. The second slot structure is formed on the second backplane assembly. The second engaging hook is disposed on the third backplane assembly and movable relative to the third backplane assembly between a second engaging position and a second disengaging position. The second engaging hook includes a second operating portion, a second engaging portion and a second connecting portion. The second operating portion is exposed out of the uncovered side of the third backplane assembly. The second engaging portion is exposed out of the covered side of the third backplane assembly. The second engaging portion engages with the second slot structure when the second engaging hook is located at the second engaging position, and the second engaging portion disengages from the second slot structure when the second engaging hook is located at the second disengaging position. The second connecting portion is connected between the second operating portion and the second engaging portion and received inside the third backplane assembly.

In summary, the present invention enables assembly or disassembly of the first module and the second module without detachment of the first module and/or the second module from the rail. Besides, the first module and/or the second module can be moved along the rail to separate the first module and the second module from each other for allowing easy insertion of an additional module between the first module and the second module after the first engaging hook is disengaged from the first slot structure, and then the first module, the additional module and the second module can be assembled together sequentially. Therefore, the present invention has not only expandability but also easy operation.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "left", "right", "front", "back", etc., is used with reference to the orientation of the Figure(s) being described. The components of the present invention can be positioned in a number of different orientations. As such, the directional terminology is used for purposes of illustration and is in no way limiting. Accordingly, the drawings and descriptions will be regarded as illustrative in nature and not as restrictive. Also, if not specified, the term "couple" or "connect" is intended to mean either an indirect or direct electrical/mechanical connection. Thus, if a first device is coupled or connected to a second device, that connection may be through a direct electrical/mechanical connection, or through an indirect electrical/mechanical connection via other devices and connections.

Besides, when an ordinal number (such as "first", "second", "third" and so on) is used as an adjective before a term, that ordinal number is used (unless expressly specified otherwise) merely to indicate a particular feature, such as to distinguish that particular feature from another feature that is described by the same term or by a similar term, but that ordinal number does not have any other meaning or limiting effect—it is merely a convenient name. For example, a "first device" may be so named merely to distinguish it from, e.g., a "second device". Thus, the mere usage of the ordinal numbers "first" and "second" before the term "device" does not indicate any other relationship between the two devices, and likewise does not indicate any other characteristics of either or both devices. For example, the mere usage of the ordinal numbers "first" and "second" before the term "device" (1) does not indicate that either device comes before or after any other in order or location; (2) does not indicate that either device occurs or acts before or after any other in time; and (3) does not indicate that either device ranks above or below any other, as in importance or quality. The mere usage of ordinal numbers does not define a numerical limit to the features identified with the ordinal numbers. For example, the mere usage of the ordinal numbers "first" and "second" before the term "device" does not indicate that there are exactly two devices.

Figure 1:
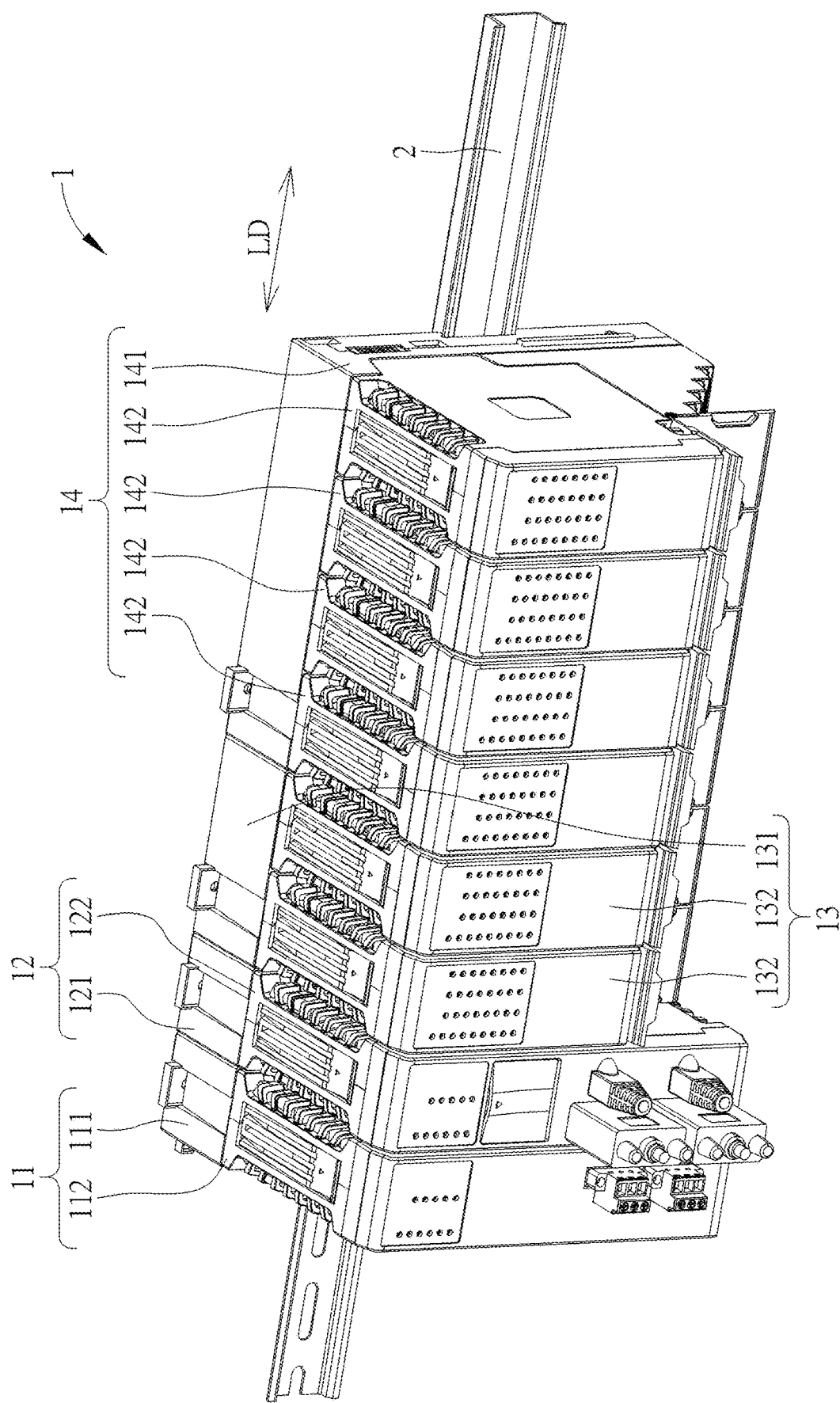
FIG. 1 and FIG. 2 are schematic diagrams of a rail mounting electronic device at different views according to an embodiment of the present invention.
Figure 2:
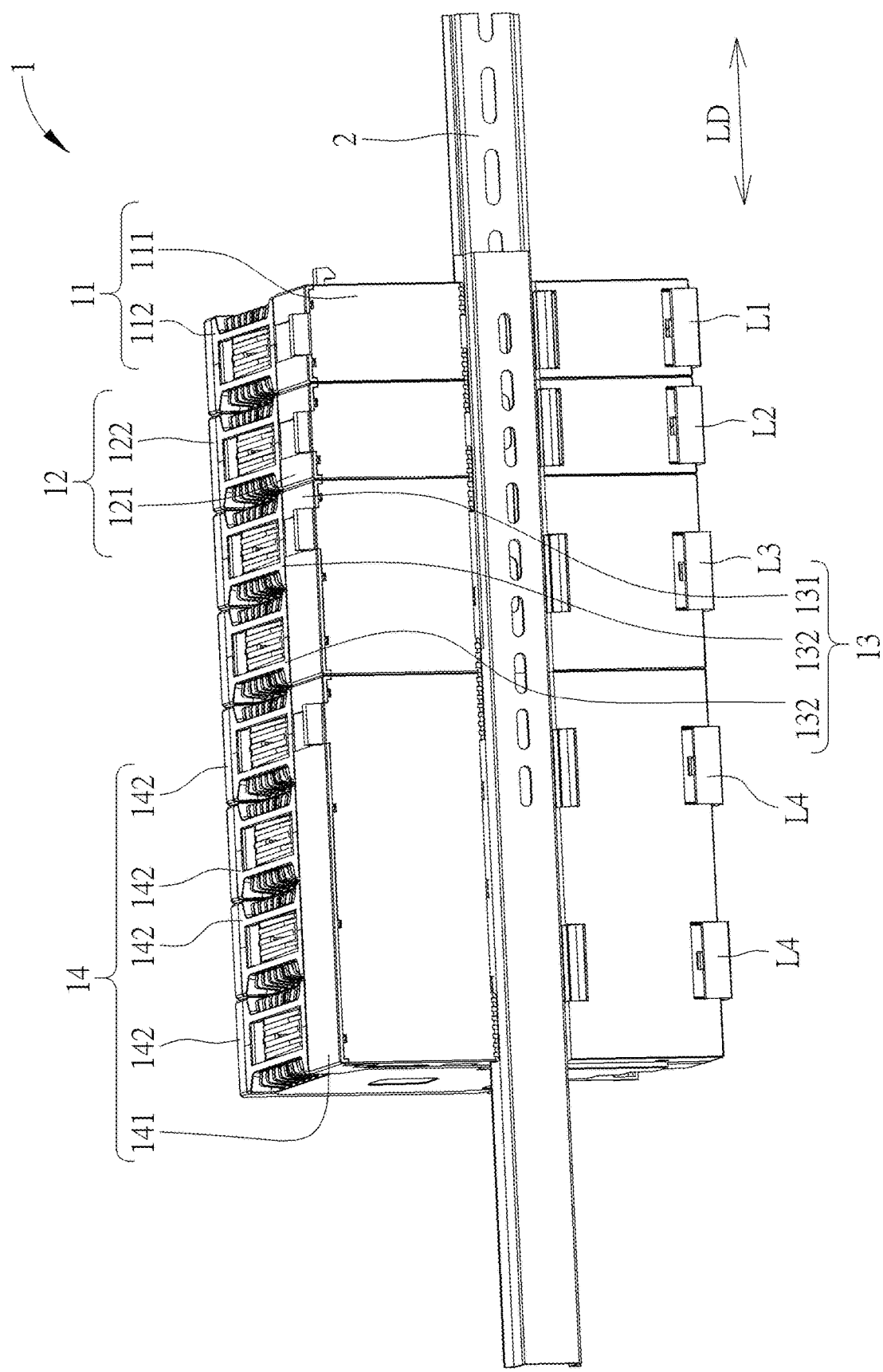
Figure 3:
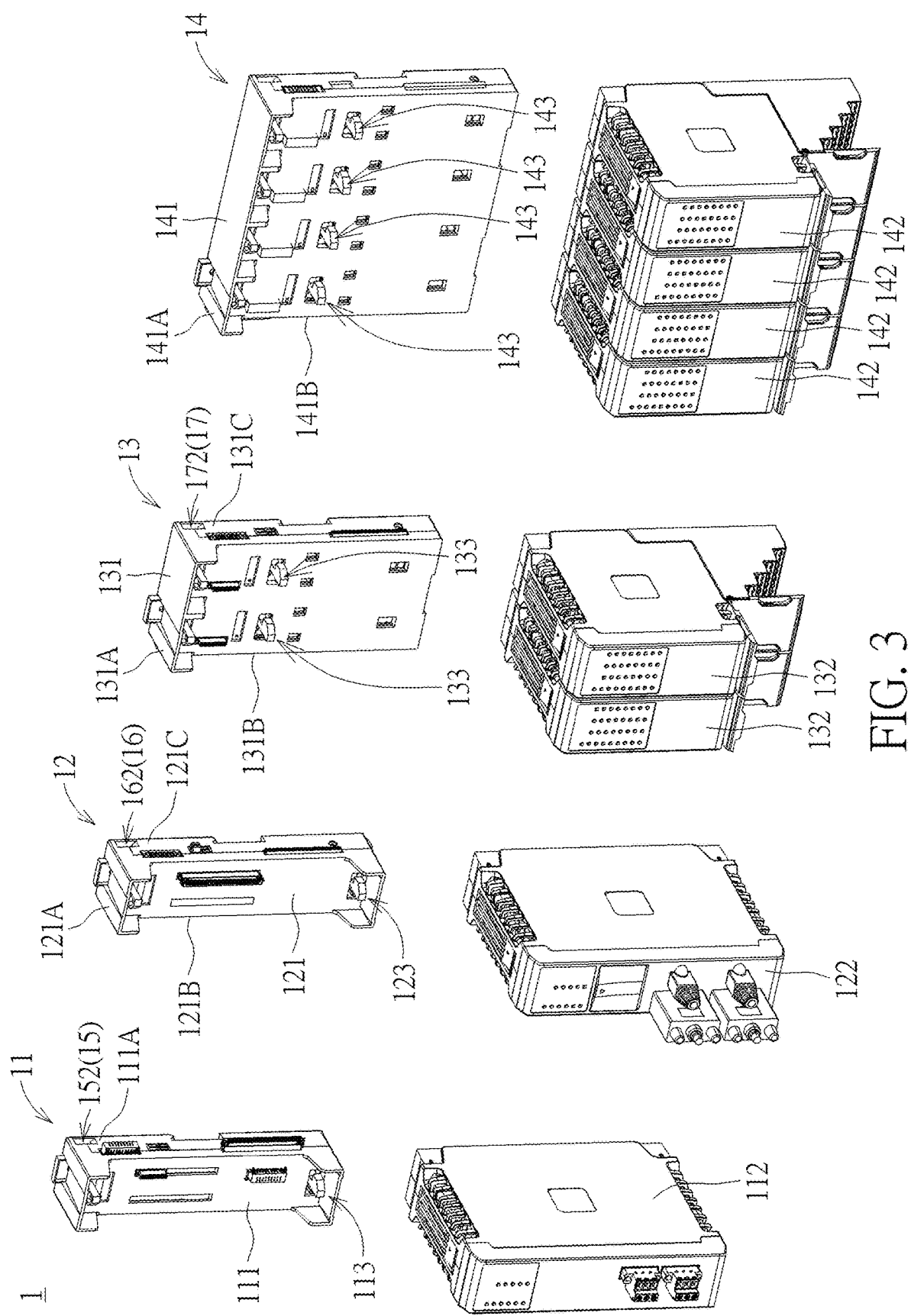
FIG. 3 and FIG. 4 are exploded diagrams of the rail mounting electronic device at different views according to the embodiment of the present invention.
Figure 4:
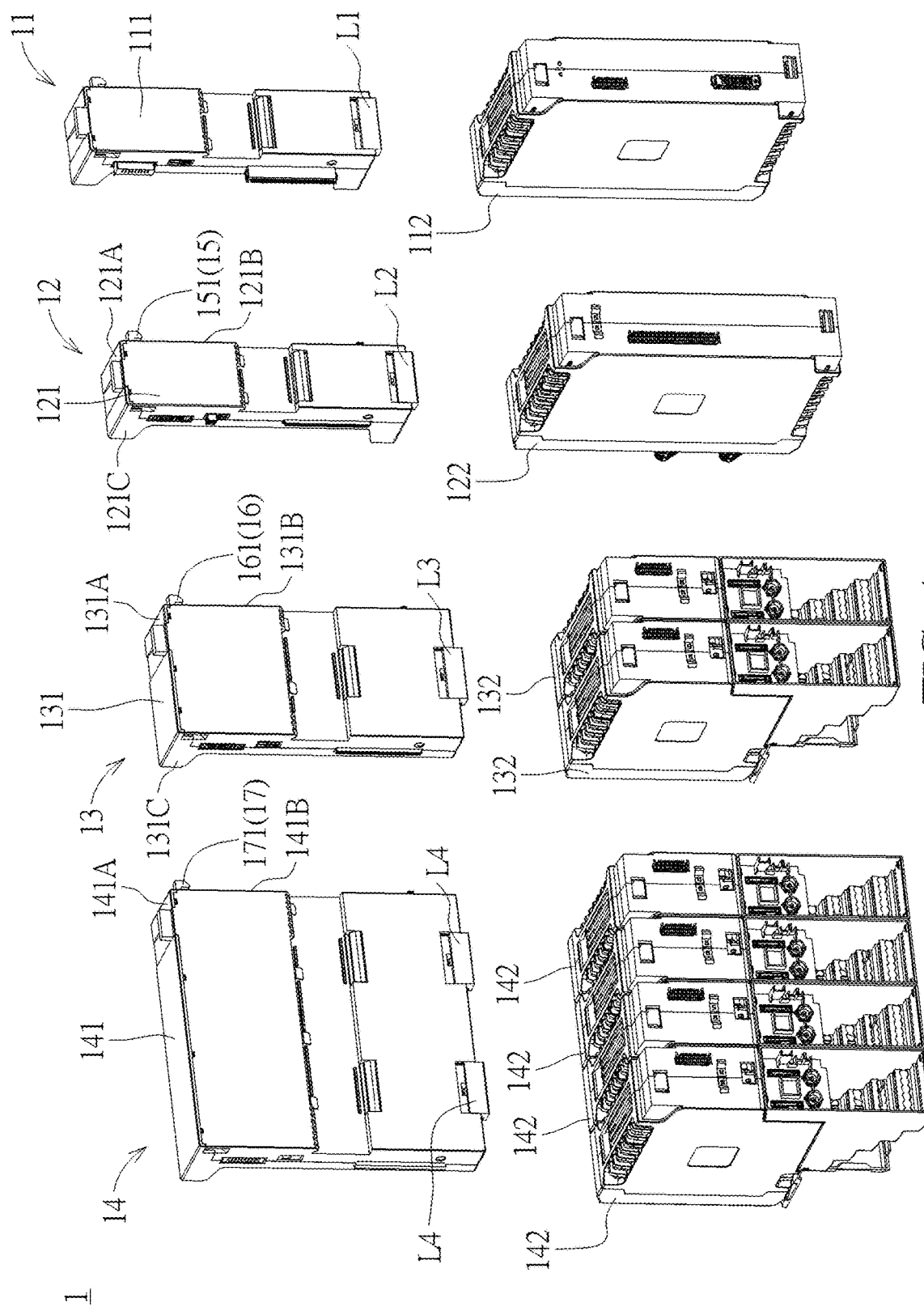
Figure 5:
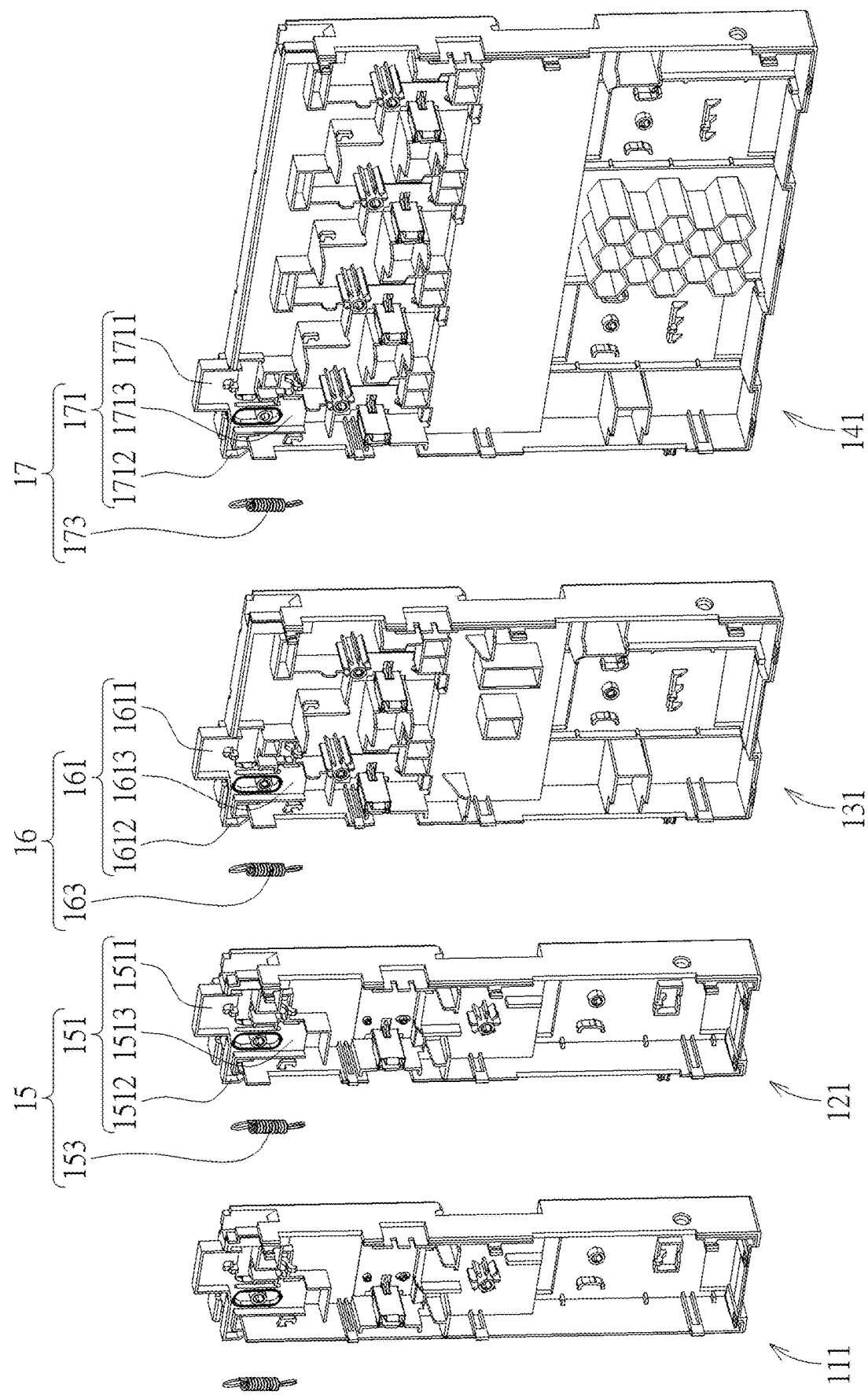
FIG. 5 is a partial internal diagram of the rail mounting electronic device to the embodiment of the present invention.

Please refer to FIG. 1 to FIG. 5. FIG. 1 and FIG. 2 are schematic diagrams of a rail mounting electronic device 1 at different views according to an embodiment of the present invention. FIG. 3 and FIG. 4 are exploded diagrams of the rail mounting electronic device 1 at different views according to the embodiment of the present invention. FIG. 5 is a partial internal diagram of the rail mounting electronic device 1 according to the embodiment of the present invention. As shown in FIG. 1 to FIG. 5, the rail mounting electronic device 1 can be a remote terminal unit detachably mounted on a rail component 2, e.g., a retractable DIN rail, and the rail mounting electronic device 1 includes a first module 11, a second module 12, a third module 13 and a fourth module 14. The second module 12 is located between the first module 11 and the third module 13 along a lateral direction LD and electrically and structurally connected to the first module 11 and the third module 13. The third module 13 is located between the second module 12 and the fourth module 14 along the lateral direction LD and electrically and structurally connected to the second module 12 and the fourth module 14. The rail mounting electronic device 1 is in an expandable configuration. Understandably, in another embodiment, there can be more or fewer modules.

Specifically, the first module 11, the second module 12, the third module 13 and the fourth module 14 can respectively be a power module, a computing module, a first input/output module and a second input/output module. However, the present invention is not limited to this embodiment. For example, in another embodiment, the first module, the second module, the third module and the fourth module can be a power module, a switch module, a computing module and one of the first input/output module and the second input/output module.

As shown in FIG. 3 and FIG. 4, the first module 11 includes a first backplane assembly 111 and a first detachable assembly 112. The second module 12 includes a second backplane assembly 121 and a second detachable assembly 122. The third module 13 includes a third backplane assembly 131 and two third detachable assembles 132. The fourth module 14 includes a fourth backplane assembly 141 and four fourth detachable assemblies 142. The first backplane assembly 111, the second backplane assembly 121, the third backplane assembly 131 and the fourth backplane assembly 141 are configured to be detachably installed on the rail component 2, e.g., by a first locking component L1 movably mounted on the first backplane assembly 111, a second locking component L2 movably mounted on the second backplane assembly 121, a third locking component L3 movably mounted on the third backplane assembly 131 and a fourth locking component L4 movably mounted on the fourth backplane assembly 141, respectively. The first detachable assembly 112, the second detachable assembly 122, the third detachable assemblies 132 and the fourth detachable assemblies 142 are detachably assembled with the first backplane assembly 111, the second backplane assembly 121, the third backplane assembly 131 and the fourth backplane assembly 141 by a first locking assembly 113, a second locking assembly 123, third locking assemblies 133 and fourth locking assemblies 143, respectively.

Furthermore, as shown in FIG. 3 to FIG. 5, the rail mounting electronic device 1 further includes a first engaging assembly 15, a second engaging assembly 16 and a third engaging assembly 17. The first engaging assembly 15 includes a first engaging hook 151 and a first slot structure 152. The second engaging assembly 16 includes a second engaging hook 161 and a second slot structure 162. The third engaging assembly 17 includes a third engaging hook 171 and a third slot structure 172. The first engaging hook 151, the second engaging hook 161 and the third engaging hook 171 are movably disposed on the second module 12, the third module 13 and the fourth module 14, respectively. The first slot structure 152, the second slot structure 162 and the third slot structure 172 are formed on the first module 11, the second module 12 and the third module 13, respectively. The first engaging hook 151 is movable relative to the second module 12 for engaging with or disengaging from the first slot structure 152. The second engaging hook 161 is movable relative to the third module 13 for engaging with or disengaging from the second slot structure 162. The third engaging hook 171 is movable relative to the fourth module 14 for engaging with or disengaging from the third slot structure 172.

Figure 6:
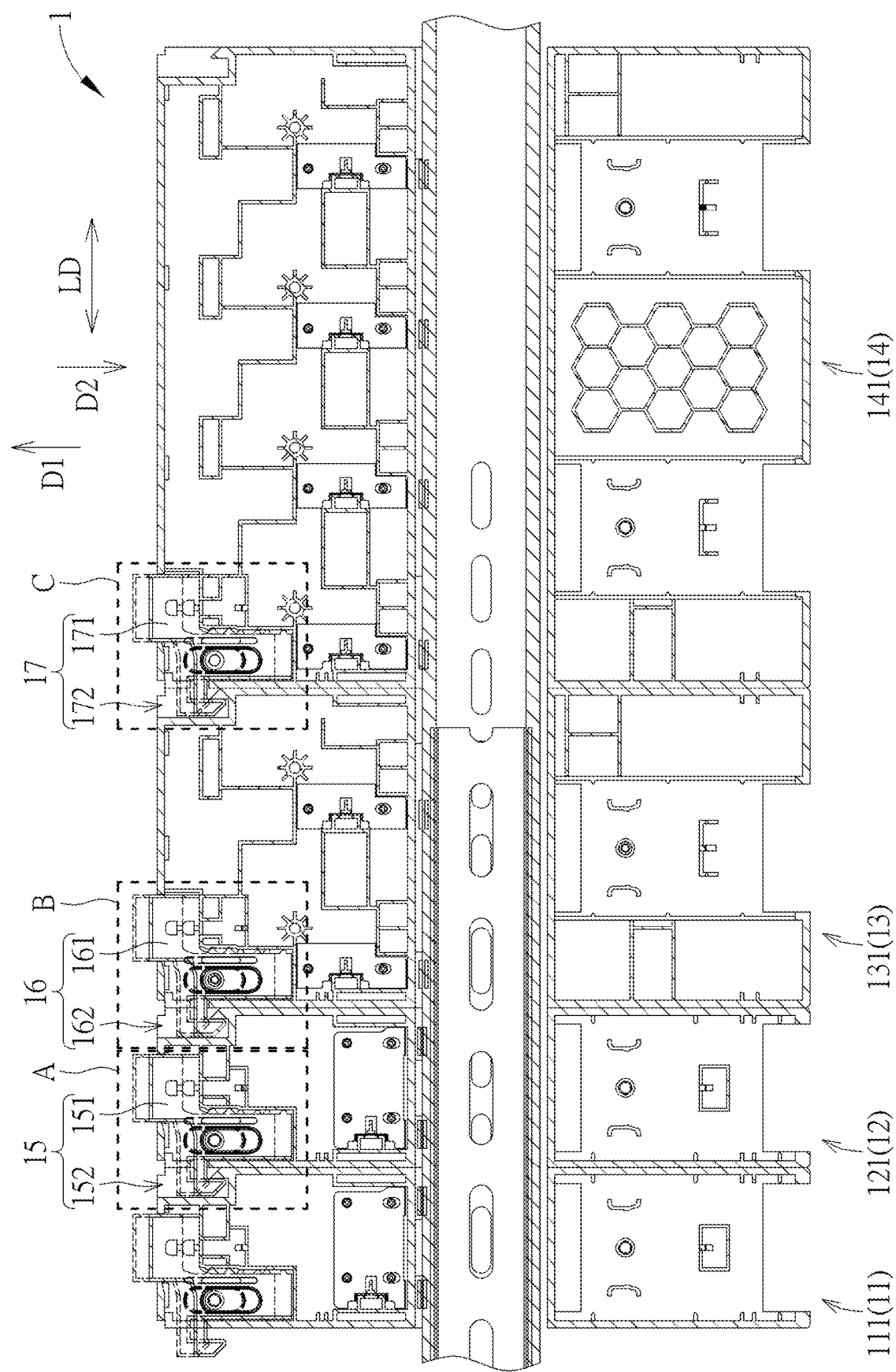
FIG. 6 is a sectional diagram of the rail mounting electronic device in an engaged state according to the embodiment of the present invention.
Figure 7:
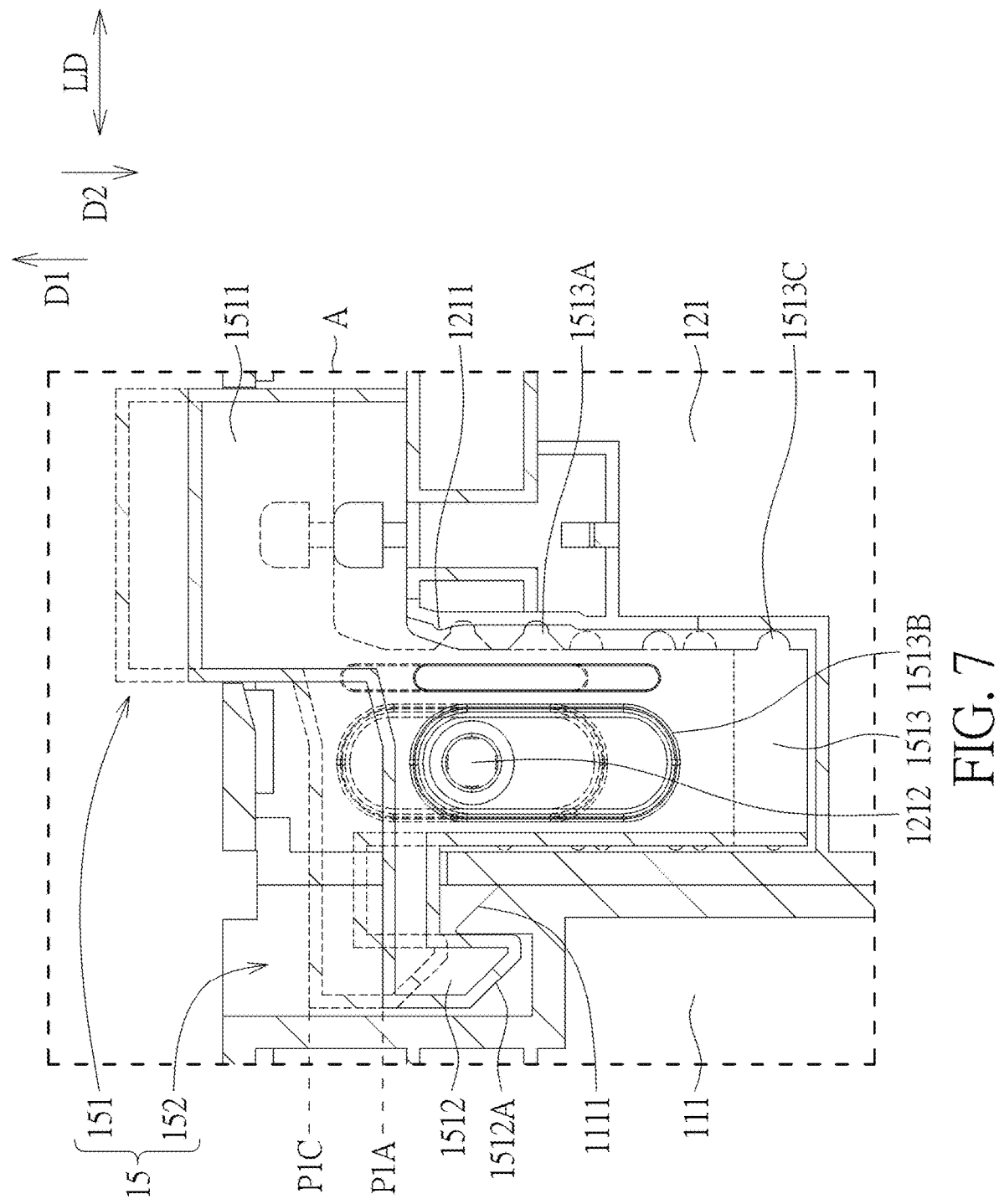
FIG. 7 is an enlarged diagram of an A portion of the rail mounting electronic device as shown in FIG. 6 according to the embodiment of the present invention.
Figure 8:
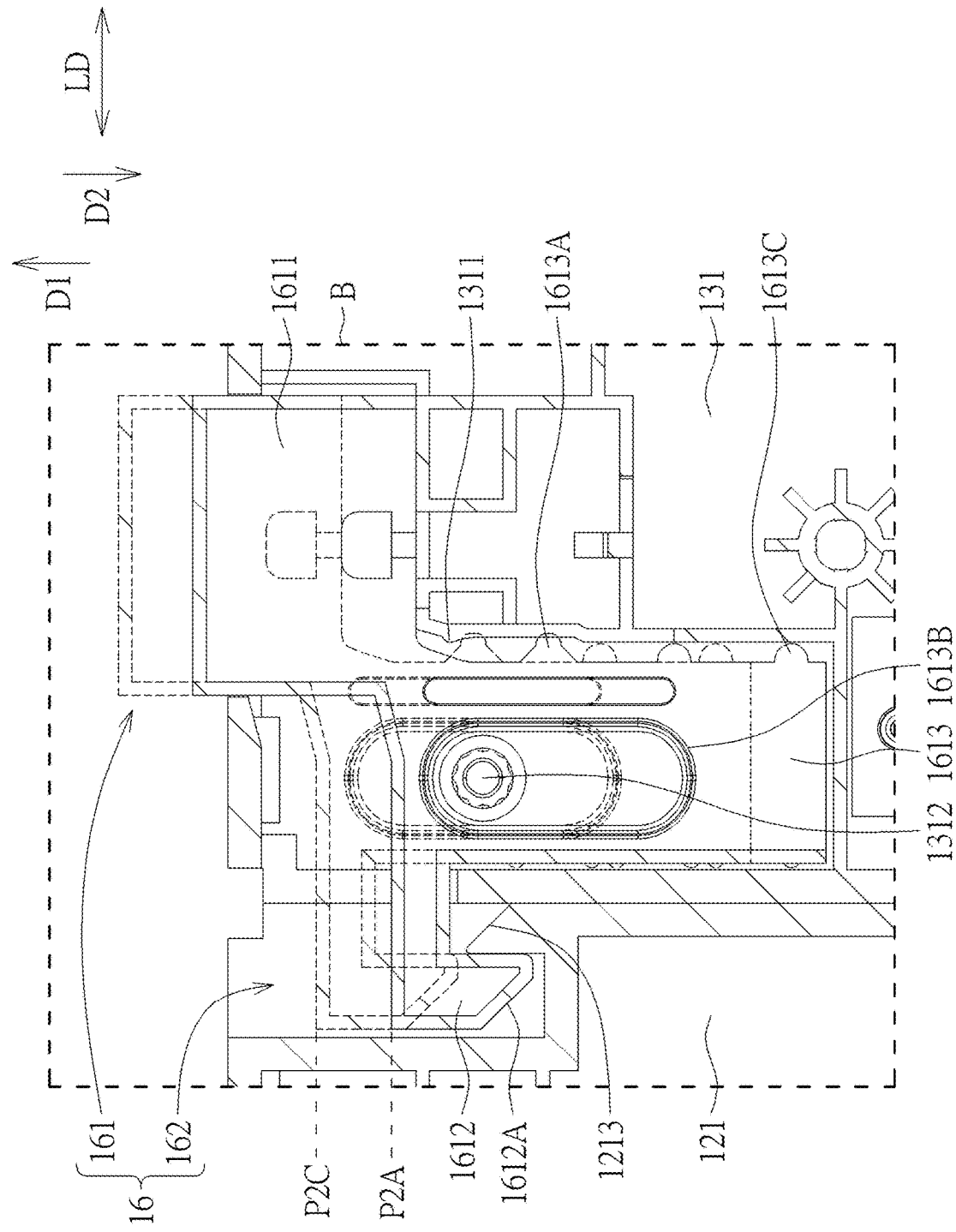
FIG. 8 is an enlarged diagram of a B portion of the rail mounting electronic device as shown in FIG. 6 according to the embodiment of the present invention.
Figure 9:
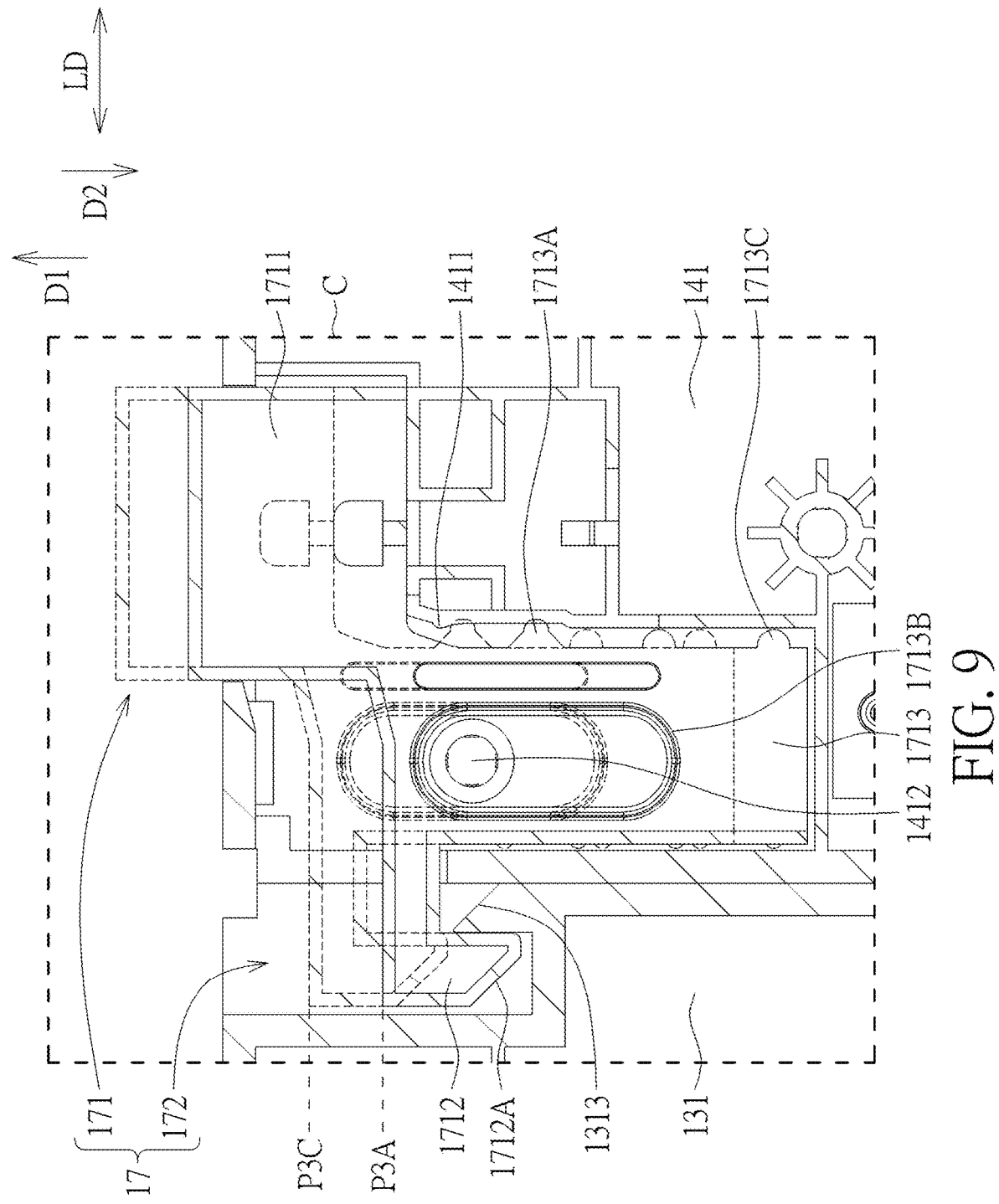
FIG. 9 is an enlarged diagram of a C portion of the rail mounting electronic device as shown in FIG. 6 according to the embodiment of the present invention.
Figure 10:
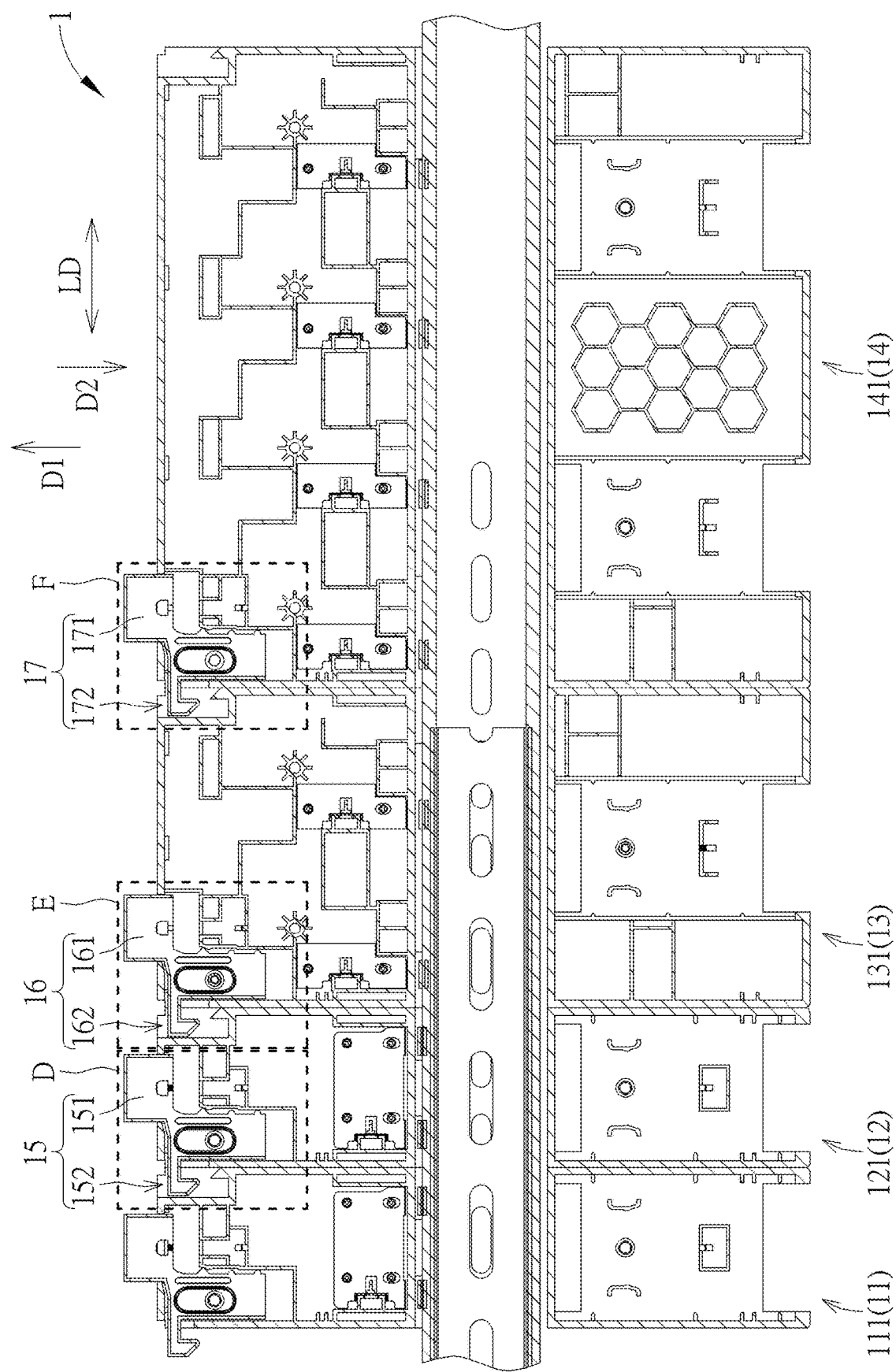
FIG. 10 is a sectional diagram of the rail mounting electronic device in a disengaged state according to the embodiment of the present invention.
Figure 11:
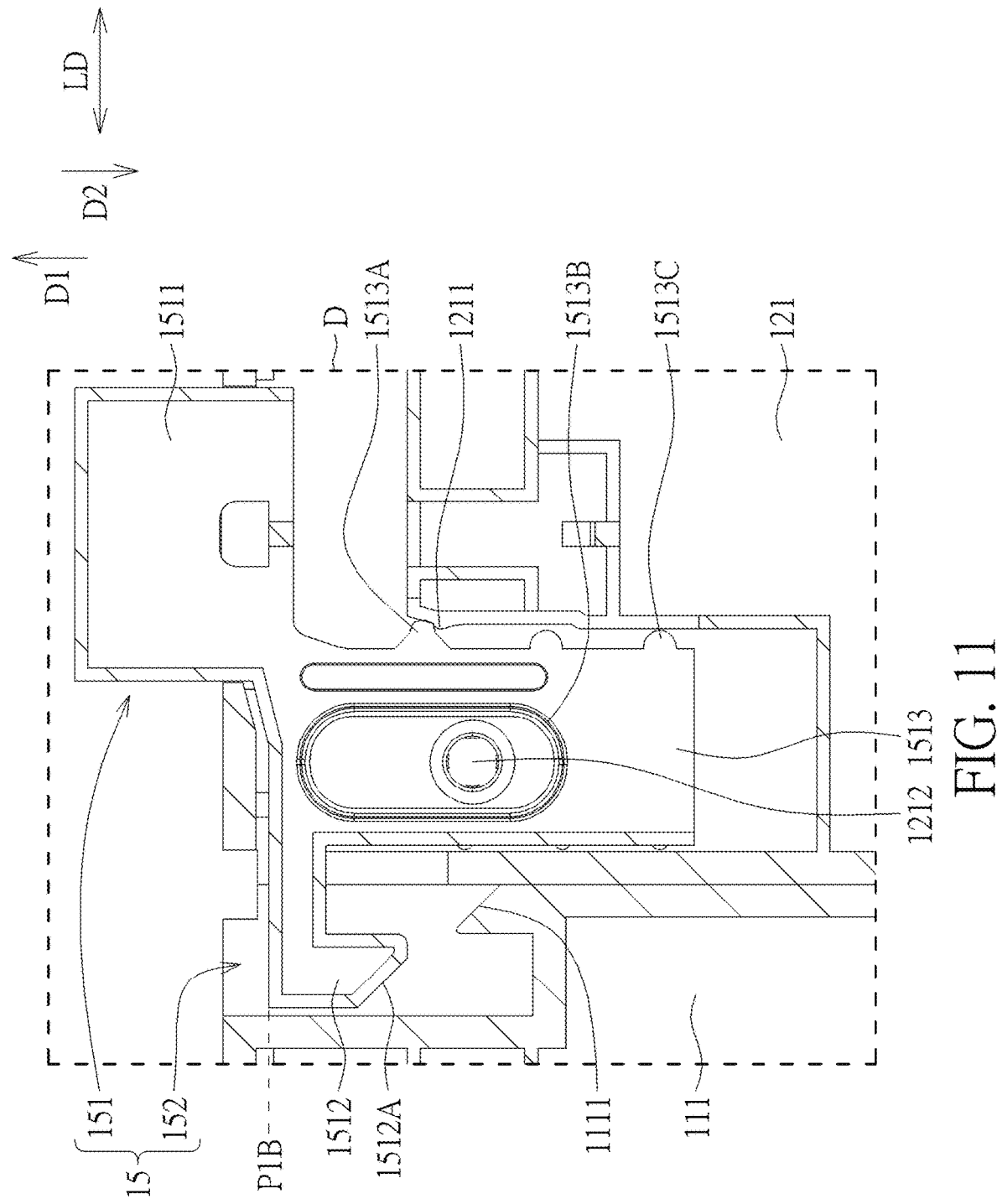
FIG. 11 is an enlarged diagram of a D portion of the rail mounting electronic device as shown in FIG. 10 according to the embodiment of the present invention.
Figure 12:
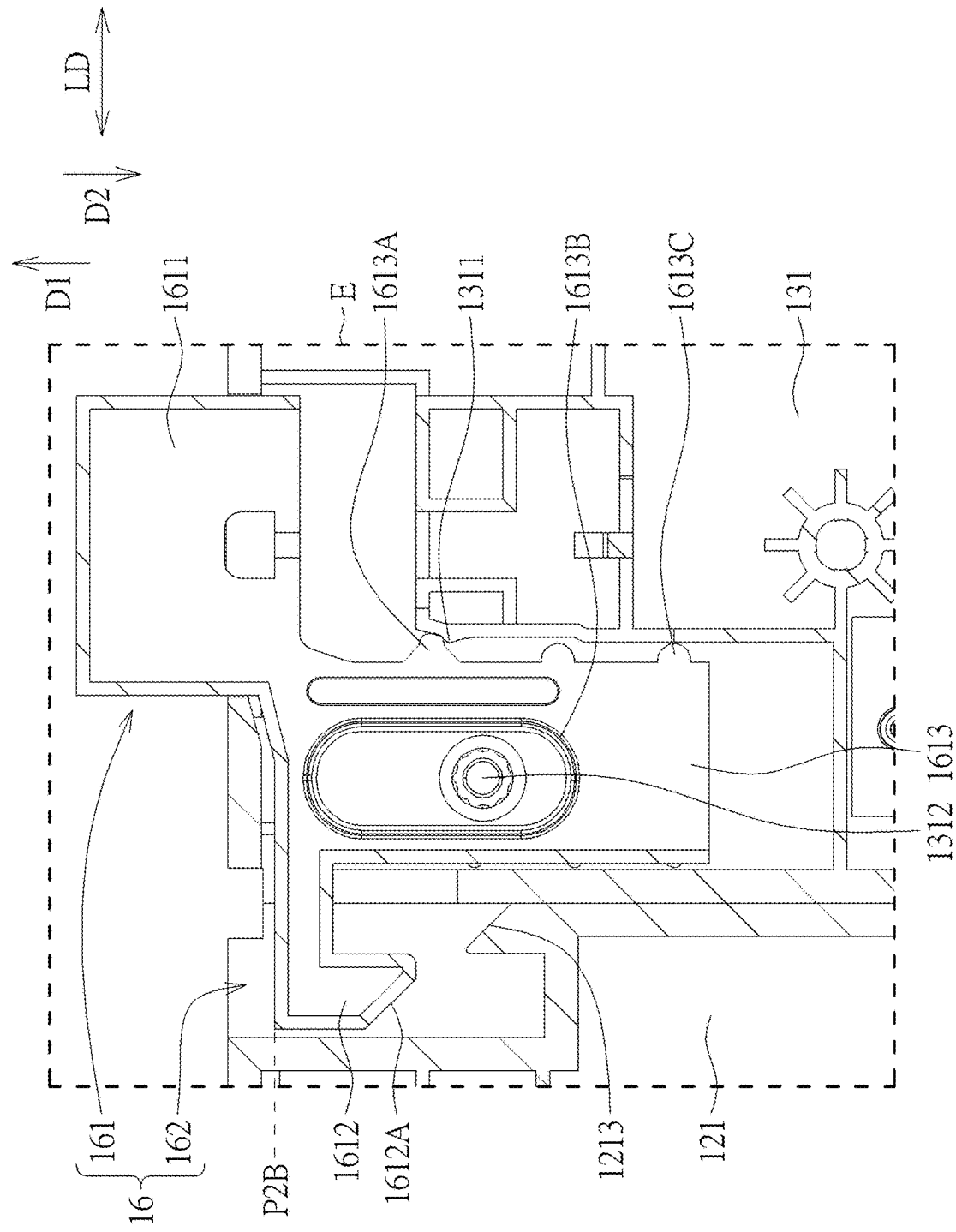
FIG. 12 is an enlarged diagram of an E portion of the rail mounting electronic device as shown in FIG. 10 according to the embodiment of the present invention.
Figure 13:
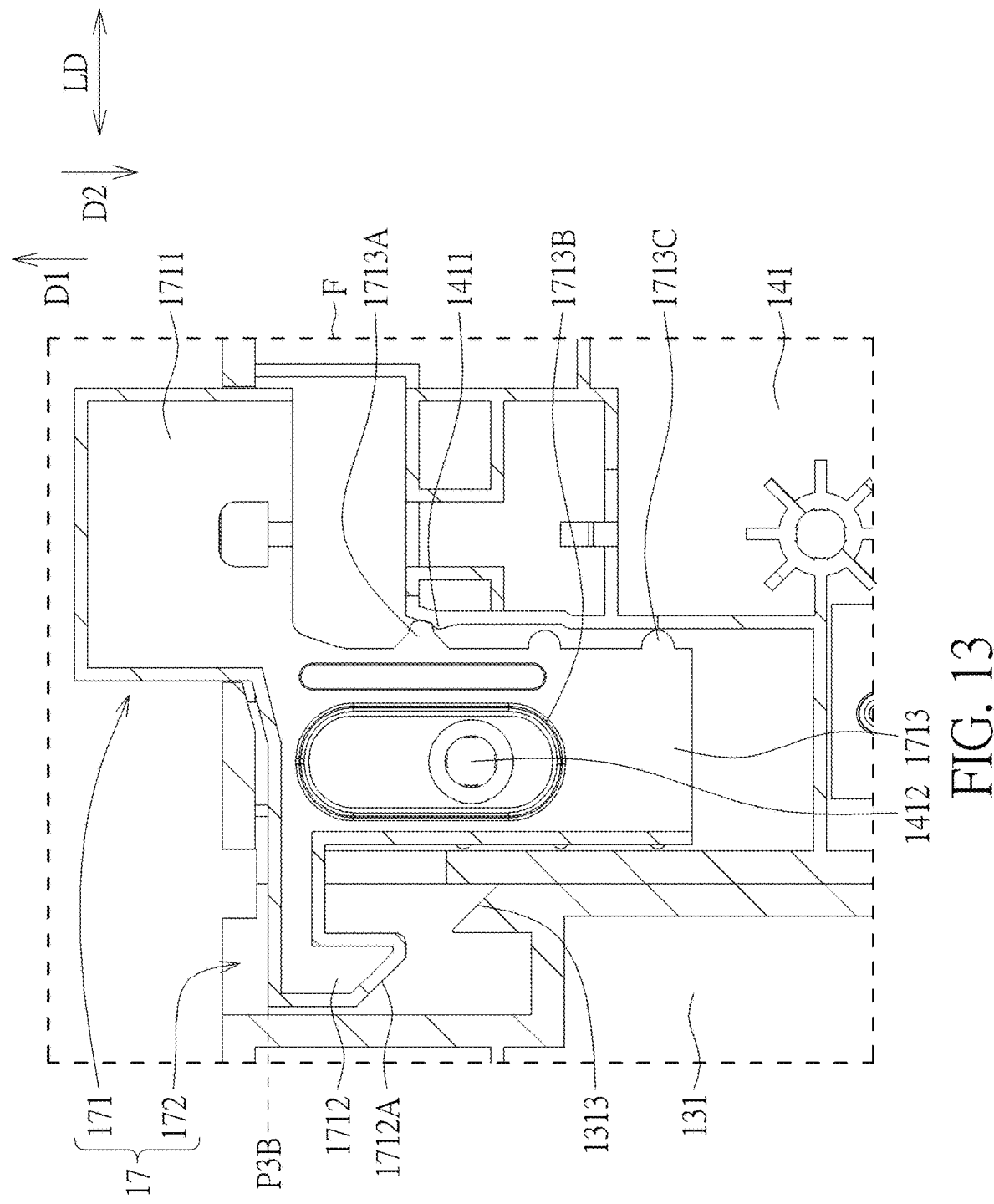
FIG. 13 is an enlarged diagram of an F portion of the rail mounting electronic device as shown in FIG. 10 according to the embodiment of the present invention.

Please refer to FIG. 6 to FIG. 13. FIG. 6 is a sectional diagram of the rail mounting electronic device 1 in an engaged state according to the embodiment of the present invention. FIG. 7 is an enlarged diagram of an A portion of the rail mounting electronic device 1 as shown in FIG. 6 according to the embodiment of the present invention. FIG. 8 is an enlarged diagram of a B portion of the rail mounting electronic device 1 as shown in FIG. 6 according to the embodiment of the present invention. FIG. 9 is an enlarged diagram of a C portion of the rail mounting electronic device 1 as shown in FIG. 6 according to the embodiment of the present invention. FIG. 10 is a sectional diagram of the rail mounting electronic device 1 in a disengaged state according to the embodiment of the present invention. FIG. 11 is an enlarged diagram of a D portion of the rail mounting electronic device 1 as shown in FIG. 10 according to the embodiment of the present invention. FIG. 12 is an enlarged diagram of an E portion of the rail mounting electronic device 1 as shown in FIG. 10 according to the embodiment of the present invention. FIG. 13 is an enlarged diagram of an F portion of the rail mounting electronic device 1 as shown in FIG. 10 according to the embodiment of the present invention. As shown in FIG. 6, FIG. 7, FIG. 10 and FIG. 11, the first engaging hook 151 is movably disposed on the second backplane assembly 121. An assembling direction of the second backplane assembly 121 relative to the first backplane assembly 111, e.g., the lateral direction LD, is substantially perpendicular to a moving direction of the first engaging hook 151 relative to the second backplane assembly 121. The first engaging hook 151 includes a first operating portion 1511, a first engaging portion 1512 and a first connecting portion 1513. The first operating portion 1511 is exposed out of an uncovered side 121A of the second backplane assembly 121. The first engaging portion 1512 is exposed out of a covered side 121B of the second backplane assembly 121. The first connecting portion 1513 is received inside the second backplane assembly 121. The first slot structure 152 is formed on a covered side 111A of the first backplane assembly 111. As shown in FIG. 7, the first engaging portion 1512 engages with the first slot structure 152 when the first engaging hook 151 is located at a first engaging position P1A. As shown in FIG. 11, the first engaging portion 1512 disengages from the first slot structure 152 when the first engaging hook 151 is located at a first disengaging position P1B.

In this embodiment, the uncovered side 121A and the covered side 121B of the second backplane assembly 121 can be an upper side and a left lateral side of the second backplane assembly 121, respectively, and the covered side 111A of the first backplane assembly 111 can be a right lateral side of the first backplane assembly 111. The uncovered side 121A of the second backplane assembly 121 can be not covered by the first backplane assembly 111 when the second backplane assembly 121 is assembled with the first backplane assembly 111. The covered side 121B of the second backplane assembly 121 can be covered by the first backplane assembly 111 when the second backplane assembly 121 is assembled with the first backplane assembly 111. The uncovered side 121A of the second backplane assembly 121 can be not covered by the second detachable assembly 122 when the second detachable assembly 122 is assembled with the second backplane assembly 121. However, the present invention is not limited to this embodiment. For example, in another embodiment, the uncovered side of the second backplane assembly 121 can be a lower side of the second backplane assembly 121.

Furthermore, as shown in FIG. 6, FIG. 7, FIG. 10 and FIG. 11, a first stopping protrusion 1513A is formed on the first connecting portion 1513, and a first cooperating stopping protrusion 1211 is formed on the second backplane assembly 121 and configured to abut against the first stopping protrusion 1513A to stop the first engaging hook 151 at the first disengaging position P1B. The first stopping protrusion 1513A passes over the first cooperating stopping protrusion 1211 when the first engaging hook 151 moves from the first engaging position P1A to the first disengaging position P1B. Besides, a first abutting surface 1512A is formed on the first engaging portion 1512, and a first cooperating abutting surface 1111 is formed on the first backplane assembly 111 and configured to abut against the first abutting surface 1512A to drive the first engaging hook 151 to move away from the first engaging position PIA, e.g., to move from the first engaging position PIA to a first predetermined position PC, for allowing the first engaging portion 1512 to at least partially enter into the first slot structure 152. The first stopping protrusion 1513A does not pass over the first cooperating stopping protrusion 1211 when the first engaging hook 151 moves from the first engaging position P1A to the first predetermined position P1C, and therefore, the first cooperating stopping protrusion 1211 does not abut against the first stopping protrusion 1513A.

In this embodiment, the first engaging assembly 15 can further include a first recovering component 153, e.g., an extension spring, configured to bias the first engaging hook 151 to move toward the first engaging position P1A. The first recovering component 153 can drive the first engaging hook 151 to move from the first predetermined position P1C to the first engaging position P1A when the first cooperating stopping protrusion 1211 does not abut against the first stopping protrusion 1513A, but the first recovering component 153 cannot drive the first engaging hook 151 to move from the first disengaging position P1B to the first engaging position P1A when the first cooperating stopping protrusion 1211 abuts against the first stopping protrusion 1513A. However, the present invention is not limited to this embodiment. For example, in another embodiment, the first recovering component 153 can be omitted.

In order to ensure a stable movement of the first engaging hook 151, a first guiding structure 1513B is formed on the first connecting portion 1513, and a first cooperating guiding structure 1212 is formed on the second backplane assembly 121 and configured to cooperate with the first guiding structure 1513B for guiding the first engaging hook 151.

In this embodiment, the first guiding structure 1513B can be a guiding slot structure, and the first cooperating guiding structure 1212 can be a guiding column structure passing through the first guiding structure 1513B and movable within the first guiding structure 1513B along a longitudinal direction of the first guiding structure 1513B. However, the present invention is not limited to this embodiment.

In addition, in order to prevent an excessive frictional force between the first engaging hook 151 and the second backplane assembly 121 for ensuring a smooth movement of the first engaging hook 151, at least one first facilitating protrusion 1513C is formed on the first connecting portion 1513 and configured to abut against the second backplane assembly 121 for facilitating a movement of the first engaging hook 151 by reducing a contacting area between the first engaging hook 151 and the second backplane assembly 121.

As shown in FIG. 6, FIG. 8, FIG. 10 and FIG. 12, the second engaging hook 161 is movably disposed on the third backplane assembly 131. An assembling direction of the third backplane assembly 131 relative to the second backplane assembly 121, e.g., the lateral direction LD, is substantially perpendicular to a moving direction of the second engaging hook 161 relative to the third backplane assembly 131. The second engaging hook 161 includes a second operating portion 1611, a second engaging portion 1612 and a second connecting portion 1613. The second operating portion 1611 is exposed out of an uncovered side 131A of the third backplane assembly 131. The second engaging portion 1612 is exposed out of a covered side 131B of the third backplane assembly 131. The second connecting portion 1613 is received inside the third backplane assembly 131. The second slot structure 162 is formed on another covered side 121C of the second backplane assembly 121. As shown in FIG. 8, the second engaging portion 1612 engages with the second slot structure 162 when the second engaging hook 161 is located at a second engaging position P2A. As shown in FIG. 12, the second engaging portion 1612 disengages from the second slot structure 162 when the second engaging hook 161 is located at a second disengaging position P2B.

In this embodiment, the uncovered side 131A and the covered side 131B of the third backplane assembly 131 can be an upper side and a left lateral side of the third backplane assembly 131, respectively, and the covered side 121C of the second backplane assembly 121 can be a right lateral side of the second backplane assembly 121 opposite to the covered side 121B of the second backplane assembly 121. The uncovered side 131A of the third backplane assembly 131 can be not covered by the second backplane assembly 121 when the third backplane assembly 131 is assembled with the second backplane assembly 121. The covered side 131B of the third backplane assembly 131 can be covered by the second backplane assembly 121 when the third backplane assembly 131 is assembled with the second backplane assembly 121. The uncovered side 131A of the third backplane assembly 131 can be not covered by the third detachable assembly 132 when the third detachable assembly 132 is assembled with the third backplane assembly 131. However, the present invention is not limited to this embodiment. For example, in another embodiment, the uncovered side of the third backplane assembly 131 can be a lower side of the third backplane assembly 131.

Furthermore, as shown in FIG. 6, FIG. 8, FIG. 10 and FIG. 12, a second stopping protrusion 1613A is formed on the second connecting portion 1613, and a second cooperating stopping protrusion 1311 is formed on the third backplane assembly 131 and configured to abut against the second stopping protrusion 1613A to stop the second engaging hook 161 at the second disengaging position P2B. The second stopping protrusion 1613A passes over the second cooperating stopping protrusion 1311 when the second engaging hook 161 moves from the second engaging position P2A to the second disengaging position P2B. Besides, a second abutting surface 1612A is formed on the second engaging portion 1612, and a second cooperating abutting surface 1213 is formed on the second backplane assembly 121 and configured to abut against the second abutting surface 1612A to drive the second engaging hook 161 to move away from the second engaging position P2A, e.g., to move from the second engaging position P2A to a second predetermined position P2C, for allowing the second engaging portion 1612 to at least partially enter into the second slot structure 162. The second stopping protrusion 1613A does not pass over the second cooperating stopping protrusion 1311 when the second engaging hook 161 moves from the second engaging position P2A to the second predetermined position P2C.

In this embodiment, the second engaging assembly 16 can further include a second recovering component 163, e.g., an extension spring, configured to bias the second engaging hook 161 to move toward the second engaging position P2A. The second recovering component 163 can drive the second engaging hook 161 to move from the second predetermined position P2C to the second engaging position P2A when the second cooperating stopping protrusion 1311 does not abut against the second stopping protrusion 1613A, but the second recovering component 163 cannot drive the second engaging hook 161 to move from the second disengaging position P2B to the second engaging position P2A when the second cooperating stopping protrusion 1311 abuts against the second stopping protrusion 1613A. However, the present invention is not limited to this embodiment. For example, in another embodiment, the second recovering component 163 can be omitted.

In order to ensure a stable movement of the second engaging hook 161, a second guiding structure 1613B is formed on the second connecting portion 1613, and a second cooperating guiding structure 1312 is formed on the third backplane assembly 131 and configured to cooperate with the second guiding structure 1613B for guiding the second engaging hook 161.

In this embodiment, the second guiding structure 1613B can be a guiding slot structure, and the second cooperating guiding structure 1312 can be a guiding column structure passing through the second guiding structure 1613B and movable within the second guiding structure 1613B along a longitudinal direction of the second guiding structure 1613B. However, the present invention is not limited to this embodiment.

In addition, in order to prevent an excessive frictional force between the second engaging hook 161 and the third backplane assembly 131 for ensuring a smooth movement of the second engaging hook 161, at least one second facilitating protrusion 1613C is formed on the second connecting portion 1613 and configured to abut against the third backplane assembly 131 for facilitating a movement of the second engaging hook 161 by reducing a contacting area between the second engaging hook 161 and the third backplane assembly 131.

As shown in FIG. 6, FIG. 9, FIG. 10 and FIG. 13, the third engaging hook 171 is movably disposed on the fourth backplane assembly 141. An assembling direction of the fourth backplane assembly 141 relative to the third backplane assembly 131, e.g., the lateral direction LD, is substantially perpendicular to a moving direction of the third engaging hook 171 relative to the fourth backplane assembly 141. The third engaging hook 171 includes a third operating portion 1711, a third engaging portion 1712 and a third connecting portion 1713. The third operating portion 1711 is exposed out of an uncovered side 141A of the fourth backplane assembly 141. The third engaging portion 1712 is exposed out of a covered side 141B of the fourth backplane assembly 141. The third connecting portion 1713 is received inside the fourth backplane assembly 141. The third slot structure 172 is formed on another covered side 131C of the third backplane assembly 131. As shown in FIG. 9, the third engaging portion 1712 engages with the third slot structure 172 when the third engaging hook 171 is located at a third engaging position P3A. As shown in FIG. 13, the third engaging portion 1712 disengages from the third slot structure 172 when the third engaging hook 171 is located at a third disengaging position P3B.

In this embodiment, the uncovered side 141A and the covered side 141B of the fourth backplane assembly 141 can be an upper side and a left lateral side of the fourth backplane assembly 141, respectively, and the covered side 131C of the third backplane assembly 131 can be a right lateral side of the third backplane assembly 131 opposite to the covered side 131B of the third backplane assembly 131. The uncovered side 141A of the fourth backplane assembly 141 can be not covered by the third backplane assembly 131 when the fourth backplane assembly 141 is assembled with the third backplane assembly 131. The covered side 141B of the fourth backplane assembly 141 can be covered by the third backplane assembly 131 when the fourth backplane assembly 141 is assembled with the third backplane assembly 131. The uncovered side 141A of the fourth backplane assembly 141 can be not covered by the fourth detachable assembly 142 when the fourth detachable assembly 142 is assembled with the fourth backplane assembly 141. However, the present invention is not limited to this embodiment. For example, in another embodiment, the uncovered side of the fourth backplane assembly 141 can be a lower side of the fourth backplane assembly 141.

Furthermore, as shown in FIG. 6, FIG. 9, FIG. 10 and FIG. 13, a third stopping protrusion 1713A is formed on the third connecting portion 1713, and a third cooperating stopping protrusion 1411 is formed on the fourth backplane assembly 141 and configured to abut against the third stopping protrusion 1713A to stop the third engaging hook 171 at the third disengaging position P3B. The third stopping protrusion 1713A passes over the third cooperating stopping protrusion 1411 when the third engaging hook 171 moves from the third engaging position P3A to the third disengaging position P3B. Besides, a third abutting surface 1712A is formed on the third engaging portion 1712, and a third cooperating abutting surface 1313 is formed on the third backplane assembly 131 and configured to abut against the third abutting surface 1712A to drive the third engaging hook 171 to move away from the third engaging position P3A, e.g., to move from the third engaging position P3A to a third predetermined position P3C, for allowing the third engaging portion 1712 to at least partially enter into the third slot structure 172. The third stopping protrusion 1713A does not pass over the third cooperating stopping protrusion 1411 when the third engaging hook 171 moves from the third engaging position P3A to the third predetermined position P3C.

In this embodiment, the third engaging assembly 17 can further include a third recovering component 173, e.g., an extension spring, configured to bias the third engaging hook 171 to move toward the third engaging position P3A. The third recovering component 173 can drive the third engaging hook 171 to move from the third predetermined position P3C to the third engaging position P3A when the third cooperating stopping protrusion 1411 does not abut against the third stopping protrusion 1713A, but the third recovering component 173 cannot drive the third engaging hook 171 to move from the third disengaging position P3B to the third engaging position P3A when the third cooperating stopping protrusion 1411 abuts against the third stopping protrusion 1713A. However, the present invention is not limited to this embodiment. For example, in another embodiment, the third recovering component 173 can be omitted.

In order to ensure a stable movement of the third engaging hook 171, a third guiding structure 1713B is formed on the third connecting portion 1713, and a third cooperating guiding structure 1412 is formed on the fourth backplane assembly 141 and configured to cooperate with the third guiding structure 1713B for guiding the third engaging hook 171.

In this embodiment, the third guiding structure 1713B can be a guiding slot structure, and the third cooperating guiding structure 1412 can be a guiding column structure passing through the third guiding structure 1713B and movable within the third guiding structure 1713B along a longitudinal direction of the third guiding structure 1713B. However, the present invention is not limited to this embodiment.

In addition, in order to prevent an excessive frictional force between the third engaging hook 171 and the fourth backplane assembly 141 for ensuring a smooth movement of the third engaging hook 171, at least one third facilitating protrusion 1713C is formed on the third connecting portion 1713 and configured to abut against the fourth backplane assembly 141 for facilitating a movement of the third engaging hook 171 by reducing a contacting area between the third engaging hook 171 and the fourth backplane assembly 141.

The first engaging assembly 15, the second engaging assembly 16 and the third engaging assembly 17 have the same operational principle. Taking the first engaging assembly 15 as an example, detailed description for the first engaging assembly 15 is provided as follows. Detailed description for the second engaging assembly 16 and the third engaging assembly 17 are omitted for simplicity. As shown in FIG. 6 and FIG. 7, during assembly of the second backplane assembly 121 and the first backplane assembly 111, the first cooperating abutting surface 1111 can abut against the first abutting surface 1512A to drive the first engaging hook 151 to move from the first engaging position P1A to the first predetermined position P1C. Afterwards, the first engaging hook 151 can be driven by the first recovering component 153 to move back to the first engaging position P1A for preventing separation of the second backplane assembly 121 and the first backplane assembly 111 after the first engaging hook 151 enters the first slot structure 152. As shown in FIG. 10 and FIG. 11, when it is desired to separate the second backplane assembly 121 from the first backplane assembly 111, the first operating portion 1511 of the first engaging hook 151 can be operated to drive the first stopping protrusion 1513A to pass over the first cooperating stopping protrusion 1211 along a first direction D1 substantially perpendicular to the lateral direction LD to move the first engaging hook 151 from the first engaging position P1A to the first disengaging position P1B for disengaging the first engaging portion 1512 from the first slot structure 152. When the first engaging hook 151 is located at the first disengaging position P1B for disengaging the first engaging portion 1512 from the first slot structure 152, the first cooperating stopping protrusion 1211 can abut against the first stopping protrusion 1513A to stop the first engaging hook 151 at the first disengaging position P1B by overcoming a resilient force generated by the first recovering component 153. Therefore, at this moment, the first module 11 and/or the second module 12 can be moved along the rail to separate the first module 11 and the second module 12 from each other freely.

When it is desired to assemble the second backplane assembly 121 with the first backplane assembly 111, the second backplane assembly 121 can be moved close to the first backplane assembly 111 to drive the first engaging portion 1512 into the first slot structure 152. Afterwards, the first operating portion 1511 can be operated to drive the first stopping protrusion 1513A to pass over the first cooperating stopping protrusion 1211 along a second direction D2 opposite to the first direction D1 to move the first engaging hook 151 away from the first disengaging position P1B. After the first engaging hook 151 moves away from the first disengaging position P1B, the first operating portion 1511 can be further operated to drive the first engaging hook 151 to move to the first engaging position P1A, or the first operating portion 1511 can be released to allow the first engaging hook 151 to be driven to move to the first engaging position P1A by the resilient force generated by the first recovering component 153.

Understandably, the first engaging hook 151 also can be moved to the first engaging position P1A before the first engaging portion 1512 enters into the first slot structure 152 because the first engaging hook 151 can be driven by a cooperation of the first cooperating abutting surface 1111 and the first abutting surface 1512A to move from the first engaging position P1A to the first predetermined position P1C for allowing the first engaging portion 1512 to enter into the first slot structure 152 and then the first engaging hook 151 can further be driven by the resilient force generated by the first recovering component 153 to move from the first predetermined position P1C to the first engaging position P1A for engaging the first engaging hook 151 with the first slot structure 152 during assembly of the second backplane assembly 121 and the first backplane assembly 111.

Besides, understandably, the corresponding backplane assembly, the corresponding engaging hook and the corresponding slot structure can be grouped together as a unit, with or without the corresponding recovering component. For example, the second backplane assembly 121, the first engaging hook 151 and the second slot structure 162 can be grouped together, so as to be considered as a backplane assembly kit, with or without the first recovering component 153, such that the first backplane assembly 111 and the third backplane assembly 131 can respectively be considered as a first cooperating backplane assembly and a second cooperating backplane assembly with respect to the backplane assembly kit, which are located at two opposite sides of the backplane assembly kit along the lateral direction LD, and the first slot structure 152 and the second engaging hook 161 can respectively be considered as a cooperating slot structure and a cooperating engaging hook with respect to the backplane assembly kit.

In contrast to the prior art, the present invention enables assembly or disassembly of the first module and the second module without detachment of the first module and/or the second module from the rail. Besides, the first module and/or the second module can be moved along the rail to separate the first module and the second module from each other for allowing easy insertion of an additional module between the first module and the second module after the first engaging hook is disengaged from the first slot structure, and then the first module, the additional module and the second module can be assembled together sequentially. Therefore, the present invention has not only expandability but also easy operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A rail mounting backplane assembly kit comprising:
a backplane assembly configured to be mounted on a rail and detachably assembled with a first cooperating backplane assembly or a second cooperating backplane assembly; and
an engaging hook disposed on the backplane assembly and movable relative to the backplane assembly between an engaging position and a disengaging position, the engaging hook comprising:
an operating portion exposed out of the backplane assembly;
an engaging portion exposed out of the backplane assembly, the engaging portion being configured to engage with a cooperating slot structure formed on the first cooperating backplane assembly when the engaging hook is located at the engaging position, and the engaging portion being configured to disengage from the cooperating slot structure when the engaging hook is located at the disengaging position; and
a connecting portion connected between the operating portion and the engaging portion and received inside the backplane assembly; and
a slot structure formed on the backplane assembly and configured to engage with a cooperating engaging hook disposed on the second cooperating backplane assembly;
wherein a stopping protrusion is formed on the connecting portion, and a cooperating stopping protrusion is formed on the backplane assembly and configured to abut against the stopping protrusion to stop the engaging hook at the disengaging position;
wherein the backplane assembly is configured to provide a moving space, the engaging hook is at least partially movably mounted inside the moving space, the stopping protrusion protrudes from a wall of the connecting portion, and the cooperating stopping protrusion protrudes from a wall of the moving space.

2. The rail mounting backplane assembly kit of claim 1, wherein the backplane assembly comprises an uncovered side and a covered side, the uncovered side of the backplane assembly is not covered by the first cooperating backplane assembly when the backplane assembly is assembled with the first cooperating backplane assembly, the covered side of the backplane assembly is covered by the first cooperating backplane assembly when the backplane assembly is assembled with the first cooperating backplane assembly, the operating portion is exposed out of the uncovered side of the backplane assembly, the engaging portion is exposed out of the covered side of the backplane assembly, and the connecting portion is received inside the backplane assembly.

3. The rail mounting backplane assembly kit of claim 2, wherein the uncovered side of the backplane assembly is an upper side or a lower side of the backplane assembly.

4. The rail mounting backplane assembly kit of claim 1, wherein the stopping protrusion passes over the cooperating stopping protrusion when the engaging hook moves from the engaging position to the disengaging position.

5. The rail mounting backplane assembly kit of claim 4, wherein an abutting surface is formed on the engaging portion and configured to abut against a cooperating abutting surface formed on the first cooperating backplane assembly to drive the engaging hook to move away from the engaging position for allowing the engaging portion to at least partially enter into the cooperating slot structure.

6. The rail mounting backplane assembly kit of claim 5, wherein the abutting surface is configured to abut against the cooperating abutting surface to drive the engaging hook to move from the engaging position to a predetermined position, and the stopping protrusion does not pass over the cooperating stopping protrusion when the engaging hook moves from the engaging position to the predetermined position.

7. The rail mounting backplane assembly kit of claim 1, further comprises a recovering component configured to bias the engaging hook to move toward the engaging position.

8. The rail mounting backplane assembly kit of claim 1, wherein a guiding structure is formed on the connecting portion, and a cooperating guiding structure is formed on the backplane assembly and configured to cooperate with the guiding structure for guiding the engaging hook.

9. The rail mounting backplane assembly kit of claim 8, wherein the guiding structure is a guiding slot structure, and the cooperating guiding structure is a guiding column structure passing through the guiding structure and movable within the guiding structure along a longitudinal direction of the guiding structure.

10. The rail mounting backplane assembly kit of claim 1, wherein at least one facilitating protrusion is formed on the connecting portion and configured to facilitate a movement of the engaging hook.

11. The rail mounting backplane assembly kit of claim 1, wherein an assembling direction of the backplane assembly relative to the first cooperating backplane assembly and an assembling direction of the backplane assembly relative to the second cooperating backplane assembly are perpendicular to a moving direction of the engaging hook relative to the backplane assembly.

12. A rail mounting electronic device comprising:
a first module configured to be mounted on a rail;
a second module configured to be mounted on the rail and detachably assembled with the first module; and
a first engaging assembly comprising:
a first slot structure formed on the first module; and
a first engaging hook disposed on the second module and movable relative to the second module between a first engaging position and a first disengaging position, the first engaging hook comprising:
a first operating portion exposed out of the second module;
a first engaging portion exposed out of the second module, the first engaging portion engaging with the first slot structure when the first engaging hook is located at the first engaging position, and the first engaging portion disengaging from the first slot structure when the first engaging hook is located at the first disengaging position; and
a first connecting portion connected between the first operating portion and the first engaging portion and received inside the second module;
wherein the first module comprises a first backplane assembly configured to be mounted on the rail, the second module comprises a second backplane assembly configured to be mounted on the rail and detachably assembled with the first backplane assembly;
wherein a first stopping protrusion is formed on the first connecting portion, and a first cooperating stopping protrusion is formed on the second backplane assembly and configured to abut against the first stopping protrusion to stop the first engaging hook at the first disengaging position;

wherein the second backplane assembly is configured to provide a moving space, the first engaging hook is at least partially movably mounted inside the moving space, the first stopping protrusion protrudes from a wall of the first connecting portion, and the first cooperating stopping protrusion protrudes from a wall of the moving space.

13. The rail mounting electronic device of claim 12, wherein, the second backplane assembly comprises an uncovered side and a covered side, the uncovered side of the second backplane assembly is not covered by the first backplane assembly when the second backplane assembly is assembled with the first backplane assembly, the covered side of the second backplane assembly is covered by the first backplane assembly when the second backplane assembly is assembled with the first backplane assembly, the first engaging hook is movably disposed on the second backplane assembly, the first operating portion is exposed out of the uncovered side of the second backplane assembly, the first engaging portion is exposed out of the covered side of the second backplane assembly, and the first connecting portion is received inside the second backplane assembly.

14. The rail mounting electronic device of claim 12, wherein the first stopping protrusion passes over the first cooperating stopping protrusion when the first engaging hook moves from the first engaging position to the first disengaging position.

15. The rail mounting electronic device of claim 14, wherein a first abutting surface is formed on the first engaging portion, and a first cooperating abutting surface is formed on the first backplane assembly and configured to abut against the first abutting surface to drive the first engaging hook to move away from the first engaging position for allowing the first engaging portion to at least partially enter into the first slot structure.

16. The rail mounting electronic device of claim 15, wherein the first cooperating abutting surface is configured to abut against the first abutting surface to drive the first engaging hook to move from the first engaging position to a first predetermined position, and the first stopping protrusion does not pass over the first cooperating stopping protrusion when the first engaging hook moves from the first engaging position to the first predetermined position.

17. The rail mounting electronic device of claim 12, wherein the first engaging assembly further comprises a first recovering component configured to bias the first engaging hook to move toward the first engaging position.

18. The rail mounting electronic device of claim 12, wherein a first guiding structure is formed on the first connecting portion, and a first cooperating guiding structure is formed on the second backplane assembly and configured to cooperate with the first guiding structure for guiding the first engaging hook.

19. The rail mounting electronic device of claim 18, wherein the first guiding structure is a guiding slot structure, and the first cooperating guiding structure is a guiding column structure passing through the first guiding structure and movable within the first guiding structure along a longitudinal direction of the first guiding structure.

20. The rail mounting electronic device of claim 12, wherein at least one first facilitating protrusion is formed on the first connecting portion and configured to facilitate a movement of the first engaging hook.

21. The rail mounting electronic device of claim 12, wherein an assembling direction of the second backplane assembly relative to the first backplane assembly is perpendicular to a moving direction of the first engaging hook relative to the second backplane assembly.

22. The rail mounting electronic device of claim 13, wherein the uncovered side of the second backplane assembly is an upper side or a lower side of the second backplane assembly.

23. The rail mounting electronic device of claim 13, wherein the first module further comprises a first detachable assembly detachably assembled with the first backplane assembly, the second module further comprises a second detachable assembly detachably assembled with the second backplane assembly, and the uncovered side of the second backplane assembly is not covered by the second detachable assembly when the second detachable assembly is assembled with the second backplane assembly.

24. The rail mounting electronic device of claim 13, further comprising:
a third module comprising:
a third backplane assembly configured to be mounted on the rail and detachably assembled with the second backplane assembly, the second backplane assembly being located between the first backplane assembly and the third backplane assembly when the second backplane assembly and the third backplane assembly are assembled with the first backplane assembly and the second backplane assembly respectively, the third backplane assembly comprising an uncovered side and a covered side, the uncovered side of the third backplane assembly being not covered by the second backplane assembly when the third backplane assembly is assembled with the second backplane assembly, the covered side of the third backplane assembly being covered by the second backplane assembly when the third backplane assembly is assembled with the second backplane assembly; and
a third detachable assembly detachably assembled with the third backplane assembly, the uncovered side of the third backplane assembly being not covered by the third detachable assembly when the third detachable assembly is assembled with the third backplane assembly; and
a second engaging assembly comprising:
a second slot structure formed on the second backplane assembly; and
a second engaging hook disposed on the third backplane assembly and movable relative to the third backplane assembly between a second engaging position and a second disengaging position, the second engaging hook comprising:
a second operating portion exposed out of the uncovered side of the third backplane assembly;
a second engaging portion exposed out of the covered side of the third backplane assembly, the second engaging portion engaging with the second slot structure when the second engaging hook is located at the second engaging position, and the second engaging portion disengaging from the second slot structure when the second engaging hook is located at the second disengaging position; and
a second connecting portion connected between the second operating portion and the second engaging portion and received inside the third backplane assembly.

* * * * *